United States Patent [19]

Mattausch et al.

[11] Patent Number: 4,891,698
[45] Date of Patent: Jan. 2, 1990

[54] ARRANGEMENT FOR DPCM-CODING OF VIDEO SIGNALS

[75] Inventors: Hans J. Mattausch, Kirchheim; Fred Matthiesen; Matthias Schoebinger, both of Munich, all of Fed. Rep. of Germany

[73] Assignee: Siemens Aktiengesellschaft, Berlin and Munich, Fed. Rep. of Germany

[21] Appl. No.: 346,083

[22] Filed: May 1, 1989

[30] Foreign Application Priority Data

Jun. 14, 1988 [DE] Fed. Rep. of Germany ....... 3820233

[51] Int. Cl.⁴ .............................................. H04N 7/12
[52] U.S. Cl. ..................................... 358/135; 358/136
[58] Field of Search .................. 358/135, 136, 133, 13

[56] References Cited

U.S. PATENT DOCUMENTS 4,743,967  5/1988  Takenaka et al. .................... 358/136

FOREIGN PATENT DOCUMENTS 3331426  3/1985  Fed. Rep. of Germany .

OTHER PUBLICATIONS

"Design of DOCM Codec for VLSI Realization in CMOS Technology", by Peter Pirsch, in IEEE, vol. 73, No. 4, Apr. 1985, pp. 592–598.

Primary Examiner—James J. Groody
Assistant Examiner—Victor R. Kostak
Attorney, Agent, or Firm—Hill, Van Santen, Steadman & Simpson

[57] ABSTRACT

An arrangement for DPCM-coding of video signals. A DPCM coder wherein estimated values ($\hat{s}$) are respectively subtracted from digitized picture element signals (s) and the estimated errors are used for signal transmission after quantization and coding. Every estimated value ($\hat{s}$) is derived from a reconstructed picture element signal formed in an adder. A limiter between the first adder and the subtractor that reduces the calculating speed can be removed from the time-critical path in that the limiter function is distributed onto two paths that calculate in parallel. A subtraction of the signal taken at the adder output occurs in the one path; the subtraction of an upper or lower limit value ($\alpha \cdot G^-$, $\alpha \cdot G^+$) weighed with $\alpha$ and through-connected via a switch from the respective picture element signal (s) of the input side is carried out on the other path. An overflow recognition element and a multiplexer provide that only a difference of the two differences formed up to this point, that relate to the actual addition result (no overflow, positive overflow, negative overflow), is through-connected to a quantizer.

8 Claims, 3 Drawing Sheets

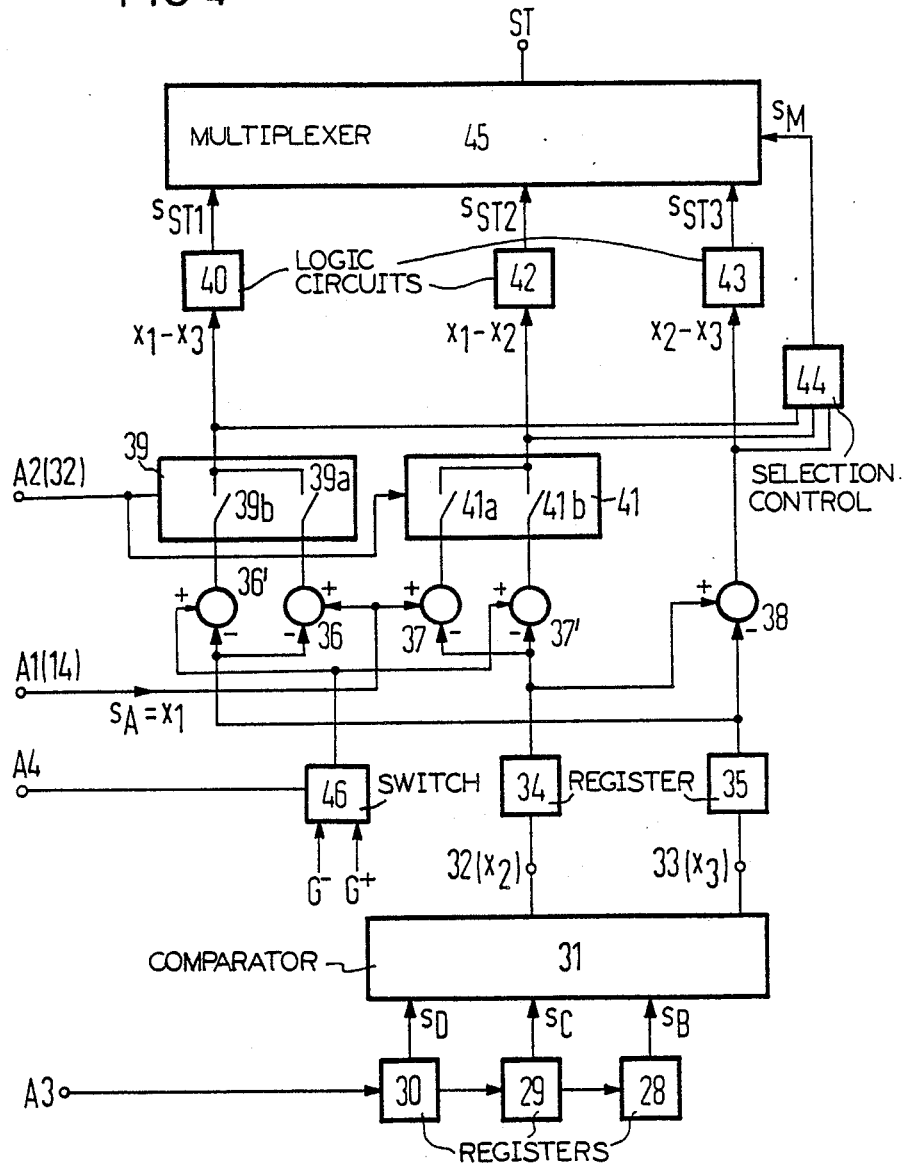

ARRANGEMENT FOR DPCM-CODING OF VIDEO SIGNALS

BACKGROUND OF THE INVENTION

The present invention is directed to an arrangement for DPCM signal coding of video signals.

An arrangement of this species that, for example is known from Proc. IEEE, Vol. 73, No. 4, Apr. 1985, pages 592 through 598, particularly FIGS. 1, 2 and 4 therein, is set forth with reference to a fundamental circuit diagram shown in FIG. 1. A sequence of digitized picture element signals s is received at an input 1 of the arrangement, these signals s being supplied via sample and hold stages that are not shown in detail. In order to reduce the data flow, an effort is made to remove redundant and irrelevant parts of the picture signal in order, for example, to be able to reduce the bit transmission rate without thereby deteriorating the picture quality. In detail, this occurs in that it is not the successive picture element signals that are transmitted via the transmission channel leading to a reception location, but rather, only the difference signals that are formed by taking the difference between a respectively current picture element signal s and an estimated value $\hat{s}$ calculated in a predictor on the basis of the preceding picture element signals are transmitted. Such a method is also referred to as difference pulse code modulation (DPCM).

German Patent Application No. P 37 14 130.9 "Anordnung zur DPCM-Codierung von Fernsehsignalen" discloses a DPCM coder wherein respective estimated values are subtracted from the digitized picture element signals and the estimated errors are used for signal transmission after quantization and coding. Every estimated value is derived from a reconstructed picture element signal formed in an adder. Separate, simultaneously subtractions of the signal taken at the adder output for both the positive and for the negative adder limit value thereby occur for the respective picture element signal of the input side. An overflow recognition means and a multiplexer provide that only that difference from the three differences formed up to this point, which is the actual addition result (not overflow, positive overflow, negative overflow) is through-connected to the quantizer. A limiter between two adders that reduces the calculating speed can thereby be eliminated in that the limiter function is distributed over three paths calculating in parallel for the positive and negative adder limit value, as well as, for the unlimited value. Three subtractors are required for the three paths in this arrangement that calculate in parallel, this denoting increased circuit complexity.

The difference formation required for a DPCM coding occurs in a subtractor 2 whose first input is connected to the input 1 and whose second input is connected to a predictor 3. Every difference signal Δ that is also referred to as an estimated error is quantized in a quantizer 4, whereby the resulting difference signal, $\Delta q = \Delta + q$, influenced by the quantization error q is coded in a coder 5 and is supplied to a transmission channel via an output 6. A recursive signal path is provided for the formation of the estimated value s, this signal path connected from a circuit point 7 at the output side of the quantizer 4 to a second input of the subtractor 2. The path contains a first adder 8, a limiter means 9 and the predictor 3. The output of the predictor 3 is also connected to a second input of the first adder 8 that forms what is referred to as a reconstructed picture element signal $S_R$ by addition of the quantized difference signal $\Delta_q$ and of the estimated value $\hat{s}$. The predictor 3 supplies the estimated value s from at least one of the preceding picture element signals for every current picture element signal $\hat{s}$.

When, according to FIG. 2, the current picture element lying in the line n in a video picture m is referenced X, the picture element sampled immediately therebefore is referenced A, the picture element of the preceding line n-1 corresponding to X is referenced C and the picture elements neighboring the latter and sampled immediately before or after that are referenced B and D and when, further, the corresponding picture elements of the preceding image m-1 are referenced X' and A' through D', the following then results: the picture element signals of at least one of the points A through D can be utilized for the formation of the estimated value s for the picture element signal of X, whereby one speaks of a two-dimensional (2D) prediction. When the picture element signals of at least one of the picture elements X' and A' through D' are employed exclusively or in addition thereto, then there is a three-dimensional (3D) prediction. In the former instance, the estimated value s can be calculated, for example, according to the 2D estimation equation:

$$s = \alpha \cdot s_A + \beta \cdot s_B + \gamma \cdot s_C + \delta \cdot s_D \quad (1).$$

In the latter instance, for example, the estimated value s can be calculated according to the 3D estimation equation:

$$s = \alpha \cdot s_A + \beta \cdot s_{X'} \quad (2).$$

whereby $s_A$ references the reconstructed picture element signal of the picture element A, $s_B$ references that of the picture element B etc., and whereby the coefficients $\alpha$, $\beta$, $\gamma$, and $\delta$ represent weighing factors that are allocated to the individual picture element signals.

SUMMARY OF THE INVENTION

An object of the present invention is to provide an arrangement wherein a fast signal processing is guaranteed for a minimum plurality of subtractors.

The present invention is used in an arrangement for DPCM coding of video signals, whereby respective estimated values $(\hat{s})$ are subtracted from digitized picture element signals (s) and the difference signals thus obtained are utilized for signal transmission after a quantization and coding. The arrangement has a recursive signal path that contains a first adder for forming reconstructed picture element signals ($s_R$) from the quantized difference signals and the estimated values, a limiter means which is a predictor for forming the estimated values $(\hat{s})$ and a subtraction means for the formation of the difference signals. The subtraction means has first and second subtractors and a multiplexer. The two subtractors are connected via a multiplexer to the input of at least one quantizer that carries out the quantization. A control input of the multiplexer is connected to an overflow recognition means controlled by the output of the first adder. In the arrangement the two subtractors have first inputs that are connected in parallel and receive the picture element signals or signals derived therefrom via a preceding subtractor. A second input of the first subtractor of the subtraction means is connected to the output of the first adder. A second input of the second subtractor of the subtraction means is connected to switch-over means. The switch-over means receives a lower limit value (α·G−) of the first added weighed with α and receives an upper limit value (−α·G+) of the first adder weighed with α. The switch-over means is also connected to a first input of the first adder when signals at a second input of the first adder lie within a value range formed by G− through G+. The switch-over means connects the lower or upper limit value (G−, G+) to the second input of the second subtractor dependent on the operational sign of a signal at the first input of the first adder. The switch-over means is connected to a second input of the first adder when signals at a first input of the first adder lie within a value range formed by G− through G+.

The preceding subtractor receives the digitized picture element signals (s) via its first input. A second input thereof is connected to the output of the first adder via a 2D or 3D predictor and via a first limiter; a second input of the preceding subtractor is connected to a first input of an additional adder whose second input is connected to the output of the first adder via a second limiter and whose output is connected to the second input of the first adder. The quantizer is fashioned switchable to different quantization characteristics. Three reconstructed picture element signals ($s_B$, $s_C$, and $s_D$) can be derived from at least one delay element. A comparison means is provided in which the greatest of these three picture element signals ($x_2$) and the smallest thereof ($x_3$) are selected. A reconstructed, current picture element signal ($x_1$) is taken at the output of the first adder. The difference quantities from the current picture element signal and the greatest picture element signal ($x_1 - x_2$) from the current picture element signal and the smallest picture element signal ($x_1 - x_3$) and from the greatest and smallest picture element signal ($x_2 - x_3$) are identified. A logic circuit is provided for each of these difference quantities, the allocation to a plurality of limit values and to amplitude classes thereby defined being identified in these logic circuits and a class-associated control signal ($s_{ST1}$, $s_{ST2}$, $s_{ST3}$) corresponding to this allocation being formed therein. The control signal of the class-associated control signals that belongs to the greatest of the three difference quantities ($x_1 - x_2$, $x_1 - x_3$, $x_2 - x_3$) is applied to a control input of the quantizer via a second multiplexer, so that a quantization characteristic allocated to this class-associated control signal is selected. A further subtractor is provided in addition to another subtractor forming the difference quantity between the current picture element signal ($x_1$) and the smallest of the picture element signals ($x_3$), whereby the respective difference between the upper or lower limit value (G+, G−) of the first adder and the smallest of the second picture element signals ($x_3$) is formed in this further subtractor dependent on the operational sign of a signal at the input of the switch-over means. A third multiplexer controlled by the overflow recognition means is provided, this third multiplexer forwarding only one of the results formed in the two last-cited subtractors to the allocated logic circuit as the difference quantity between the current picture element signal and the smallest picture element signal ($x_1 - x_3$). Another additional subtractor is provided in addition to another subtractor that forms the difference quantity between the current picture element signal and the greatest of the picture element signals ($x_1 - x_2$), whereby the respect difference between the upper or lower limit value (G+, G−) of the first adder and the greatest of the picture element signals ($x_2$) is formed in this latter subtractor dependent on the operational sign of a signal at the input of the switch-over means. A fourth multiplexer controlled by the overflow recognition means is provided, this fourth multiplexer forwarding one of the results formed in the two last-cited subtractors to the following logic circuit as the difference quantity between the current picture element signal and the greatest picture element signal ($x^1 - x^2$). The second multiplexer is controlled via a selection control that receives the operational sign of the difference quantities supplied to the logic circuits.

The advantage obtainable with the present invention is that the circuit complexity for the parallelization of the limiter function in a DPCM loop is reduced and, thus, a more compact structure of an arrangement for DPCM coding of video signals is possible. The arrangement of the invention is suitable for utilization both in 2D, as well as, in 3D DPCM coding methods. It can be realized in a relatively simple manner in integrated circuit technology on a semiconductor substrate.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIG. 4 is a development of the arrangement according to FIG. 3.

DESCRIPTION OF THE PREFERRED EMBODIMENT

Figure 1:
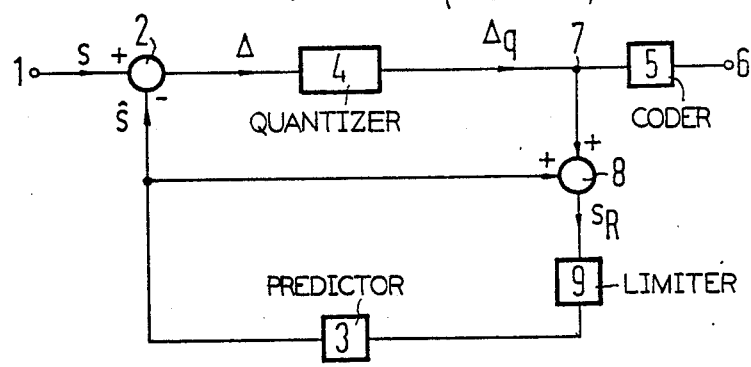
FIG. 1 is a fundamental block diagram of a prior art arrangement for DPCM coding.
Figure 2:
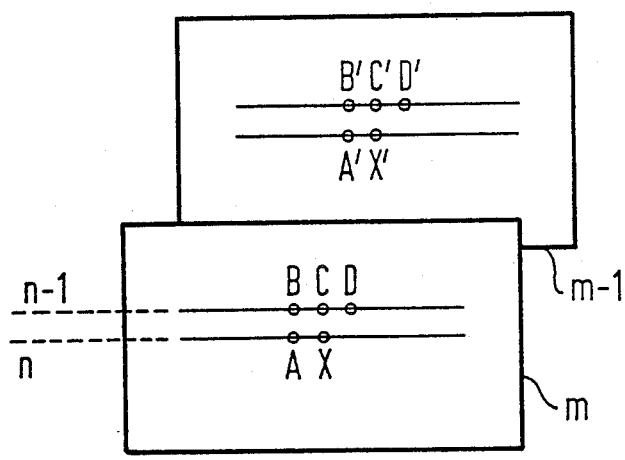
FIG. 2 is an illustration of individual picture elements of two successive video pictures for explaining FIG. 1.
Figure 3:
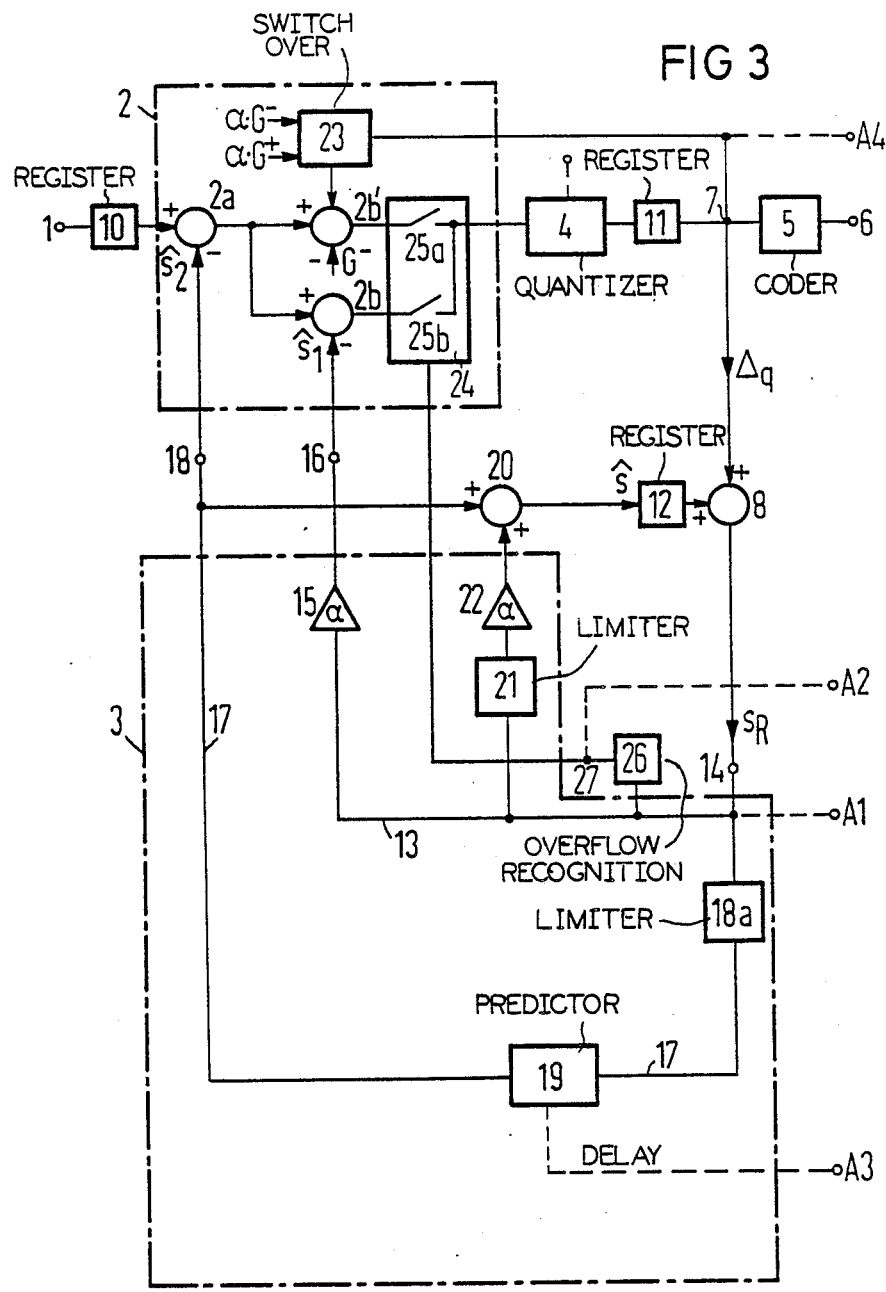
FIG. 3 is a first exemplary embodiment of the present invention.

FIG. 3 shows an arrangement having the subtractor 2 of the present invention that is based on the fundamental structure of a DPCM coder shown in FIG. 1. Provided in addition to the function units already set forth in FIG. 1 are registers 10, 11 and 12 which receive clock pulse voltages, wherein the register 10 is in series with the input 1, register 11 is connected between circuit parts 4 and 7, and register 12 is located before the second input of the adder 8. Let a current picture element signal s that, for example, corresponds to the picture element X (see FIG. 2) be stored in the register 10 at the beginning of a clock pulse period i, let a quantized difference signal $\Delta_q$ that is derived from the picture element signal s of the period i−1 and, thus, from the picture element A be stored in the register 11, and let an estimated value s that is formed from the picture element signals of a few clock pulse periods occurring chronologically therebefore be stored in the register 12. There is thereby the time condition that a reconstructed picture element signal $s_R$ must be formed in the adder 8 during the clock pulse period i, a new estimated value s must be calculated in the predictor 3 (during the clock pulse period i), a difference signal Δ=s−s must be formed in the subtractor 2 (during the clock pulse period i) and a quantized signal $\Delta_q$ must be derived in the quantizer 4 (during the clock pulse period i), so that the quantized signal $\Delta_q$ has already been stored in the register 11 before the beginning of the next-successive clock pulse period i+1. The procedure is then repeated in the clock pulse period i+1, whereby the next successive picture element signal is already stored in the register 10. Thus, there is a time-critical signal path that proceeds from the output of the register 11 to the input of 11 via circuit parts 7, 8, 3, 2 and 4. The signal processing within this time-critical path must occur within one clock pulse period.

Since the predictor 3 in FIG. 3 works according to a 2D or 3D estimation equation corresponding to equation (1) or, respectively, (2), it has a first circuit branch 13 that proceeds from the input 14 to a first output 16 via a first weighing element 15 that carries out a signal weighing with a weighing factor $\alpha$. A first signal part $\hat{s}_1$ of the estimated value s acquired by use of the picture element A can be taken at this output 16. A second circuit branch 17 proceeds from 14 to a second output 18 of the predictor and serves the purpose of deriving a second signal part $\hat{s}_2$ acquired by use of the picture elements B, C and D. The signal part $s_2$, is thereby calculated via a 2D or 3D predictor 19. The estimated value $\hat{s}$ is subsequently additively composed of both signal parts $\hat{s}_1$ and $\hat{s}_2$.

The division of the estimated value $\hat{s}$ into the two signal parts $\hat{s}_1$ and $\hat{s}_2$ requires a corresponding division of the subtractor 2 of FIG. 1 into two subtractors 2a and 2b connected iteratively relative to one another, whereby the signal part $\hat{s}_2$ is subtracted in subtractor 2a from the picture element signal s stored in the register 10 and whereby the signal part $\hat{s}_1$ is in turn subtracted in subtractor 2b from the difference formed in this fashion. On the other hand, the estimated value s is calculated in an adder 20 from the signal parts $\hat{s}_2$, and $\hat{s}_1$ whereby $s_1$ is specially derived for this addition via a limiter 21 connected to the input 14 and via a weighing element 22 that simulates the weighing element 15. The output of the adder 20 is connected to the input of the register 12.

A further subtractor 2b' is provided in addition to the subtractor 2b in FIG. 3, whereby the first inputs of subtractors 2b and 2b' are connected parallel to one another. For the pre-condition that one of the two values added in the first adder 8 is certain to remain within the value range defined by the lower and upper limit values $G^-$ and $G^+$, the number of subtractors 2b, 2b' working in parallel can be limited to two. Whereas the second input of subtractor 2b is occupied with the signal part $s_1$, the second input of subtractor 2b' is connected to a switch-over means 23 that receives lower and upper limit values, $\alpha \cdot G^-$ and $\alpha \cdot G^+$ that are weighted with $\alpha$. The switch-over means is controlled by the most significant bit (operational sign bit, VZB) of the signal at the first input of the adder 8 when the signal at the second input thereof is certain to lie in the range $G^-$, $G^+$ or by the operational signal bit of the signal at the second input of the first adder 8 when the signal at range (that means that the quantizer 4 only supplies values within the range). The first possibility has been shown in FIG. 3, so that the circuit point 7 is connected to the switch-over means 23. When the signal at the first adder 8 exhibits a positive operational sign, then the upper limit value $\alpha \cdot G^+$ is connected to the second input of the subtractor 2b'. When it exhibits a negative operational sign, the lower limit value $\alpha \cdot G^-$ is connected to the second input of 2b'. When, for example, the value of the signal at the second input of the first adder 8 is certain to remain in the prescribed value range, then the operational sign of the signal at the first input of the first adder 8 indicates the operational sign of a possible overflow. When the signals at the first and second inputs of the first adder 8 have the same operational sign, then either no overflow will occur or the overflow has the same operational sign as the signal at the first input of the first adder 8. When the signals at the first and second inputs of the first adder 8 have different operational signs, then no overflow occurs when the level of the signal at the first input of the first adder 8 is less than the level of the signal at the second input. When the level of the signal at the first input of the first adder 8, however, is greater than the level of the signal at the second input of the same adder, then a possible overflow has the operational sign of the signal at the first input of the first adder 8. Since the operational sign of the possible overflow is then already known at the beginning of the operation, the parallelization can be limited to a path having overflow and to a path for no overflow. The overflow path calculates with the upper limit value $\alpha \cdot G^+$ when the signal at the first input of the adder 8 is positive and calculates with the lower limit value $\alpha \cdot G^-$ when this latter signal is negative. The outputs of the subtractors 2b and 2b' are therefore applied to the inputs of a multiplexer 24 whose output is connected to the input of the quantizer 4. An overflow recognition means 26 that is connected to the output of the adder 8 controls the multiplexer 24 via its output 27. In case the sum formed in the adder 8 exceeds the predetermined, positive or negative limit value $G^+$, $G^-$, the output 27 outputs a control signal that closes the switch 25a and connects the output of the subtractor 2b' to the input of the quantizer 4. Finally, when the sum formed in adder 8 is within the value range defined by $G^+$ and $G^-$, the switch 25b is closed, so that the difference formed in subtractor 2b is connected to the input of 4.

Since the weighing element 15 is arranged in series with the second input of the digital subtractor 2b, a weighing with a factor $\alpha$ that is expressed by a number $2^n$ (n=1, 2, etc. or −1, −2, etc.) can be realized in a simple manner in that the signal to be weighed (in this case the reconstructed picture element signal $s_R$ that, for example, is composed of eight bits) is not supplied to the inputs of those stages of the subtractor 2b corresponding to it in terms of digit position but is supplied to those stage inputs that are displaced by a corresponding place number in a direction toward more-significant or less-significant bits. The analogous case also applies to the weighing element 22 whose function can likewise be realized by a displaced allocation of the individual bits of the digital signals to be weighed to the stage inputs of the adder 20.

The output of the adder 8 is directly connected to the second input of the subtractor 2b. The sum formed in adder 8 can therefore be applied bit-by-bit to the individual stage inputs of the subtractor 2b corresponding to the carry run, namely beginning with the stage of least significance. The subtraction is thus carried out nearly parallel to the addition and is only delayed by the signal running time from the input up to the sum output of the stage of least significance in the adder 8. The function of the limiter means 9 in FIG. 1 is then realized in that two difference amounts are formed in subtractors 2b and 2b' independently of one another, only one thereof being through-connected to the quantizer 4. The decision regarding which of the two differences shall be further-processed is carried out by the overflow recognition means 26. In a corresponding way, the difference formed in the subtractor 2a is supplied to the first inputs of the subtractors 2b and 2b' bit-by-bit, namely beginning with the stage of least significance, so that the subtractions carried out in 2a and 2b also occur nearly simultaneously.

The limiter function realized according to the present invention significantly accelerates the signal processing in the recursive signal path in comparison to the signal processing according to FIG. 1 since a limiting of the sum signal in the means 9 can occur only after the execution of the full working time of the adder 8. The subtractor 2 calculates the difference between the picture element signal s and the potentially limited sum signal of the adder 8 only following thereupon.

Although the limiter 21 does not allow any nearly simultaneous sum formation in the adders 8 and 20, it nonetheless lies in a signal path proceeding from the output of the register 12 to the input of register 12 via circuit parts 8, 21, 22 and 20 that is not time-critical since no signal quantizing is undertaken therein.

FIG. 4 shows a sub-circuit that augments the arrangement of FIG. 3 to form a DPCM coder having adaptive quantization. It is thereby assumed that the quantizer 4 can be switched to one of a plurality of quantization characteristics that particularly differ from one another in that quantization steps of respectively different size are used. When the contrast of a picture element to be coded, for example X, is only slight in comparison to the picture elements surrounding it and, thus, the anticipated estimated error is small, then the quantization occurs in small steps. They switch to quantization characteristics having respectively larger quantization steps for high contrast values. The quantizer 4 is provided with a control input ST to which control signals are supplied that effect a switching for selected quantization characteristic. The sub-circuit shown in FIG. 4 represents a control circuit via which a control signal supplied to the input ST is derived.

The control circuit of FIG. 4 has four inputs that are respectively connected to the outputs A1, A2, A3 and A4 of the arrangement of FIG. 3 and therefore have the same reference characters. The input A1 corresponds to the circuit point 14 of FIG. 3; the input A2 corresponds to the output 27 of the overflow recognition means 26; the input A3 corresponds to the output of the delay element 19; and the input A4 corresponds to the first input of the first adder 8. Via input A3, the reconstructed picture element signals $s_B$, $s_C$ and $s_D$ derived from the picture elements B, C and D are successively supplied to three registers 28 through 30 connected in series relative to one another and are stored therein. These picture element signals are first compared to one another in a comparison means 31 such that the largest of these three picture element signals, this being referenced $x_2$, appears at a first output 32 of comparison means 31 and the smallest of these three signals, this being referenced $x_3$, appears at a second output 33 of comparison means 31. The signals $x_2$ and $x_3$ are stored in following registers 34 and 35. The reconstructed picture element signal $s_A$ derived from the picture element A, which shall be referenced $x_1$ below, is supplied via the input A1. The difference signal $x_1-x_3$, $x_1-x_2$ and $x_2-x_3$ are now formed. The three subtractors 36, 37 and 38 are provided for that purpose, whereby the first inputs of subtractors 36 and 37 are connected to the input A1 and the second inputs of subtractors 36 and 37 ar connected to the outputs of the registers 35 and, respectively, 34. The first input of the subtractor 38 is connected to the output of the register 34 and the second input of subtractor 38 is connected to the output of the register 35. The output of 36 is conducted via a multiplexer 39 to the input of a logic circuit 40 that classifies the difference signal $x_1-x_3$ into one of a plurality of amplitude classes and emits a class-associated control signal $s_{ST1}$ dependent on the class into which the difference signal was classified. When, for example, it is assumed that three different limit values GW1 through GW3 are defined that limit four different amplitude classes, then a first control signal $s_{ST1}$, that selects a first quantization characteristic of the quantizer 4, is output when $x_1-x_3$ is below GW1. When $x_1-x_3$ is between GW1 and GW2, then a second control signal $S_{ST1}$ results that selects a second quantization characteristic. When $x_1-x_3$ belongs to a class whose limits are established by GW2 and GW3, then a third quantization characteristic is selected, whereas an identification of the difference signal with a fourth class which is above GW3 causes a selection of the fourth quantization characteristic.

In an analogous fashion, the difference signal $x_1-x_3$ formed in the subtractor 37 is supplied via a multiplexer 41 to the input of a logic circuit 42 that outputs a class-associated control signal $s_{ST2}$ dependent on the identification of this difference signal to one of the amplitude classes cited above. Similarly, the difference signal $x_2-x_3$ is received at the input of a logic circuit 43 in which a class-associated control signal $S_{ST3}$ is generated in the manner already set forth. A selection control 44 provides a control signal $s_M$ from the operational sign bits of the difference signals $x_1-x_3$, $x_1-x_2$, and $x_2-x_3$, this control signal $s_M$ indicating which of these difference signals is the greatest. $s_M$ is then supplied to a multiplexer 45 that, dependent on $s_M$, connects only one of the control signals $s_{ST1}$, $s_{ST2}$ or $s_{ST3}$ through to the input ST of the quantizer 4, namely that control signal that had been derived from the greatest of the three last-cited difference signals.

Dependent on the maximum contrast that occurs between two picture elements within the picture element group A, B, C and D, such a control circuit (that is already fundamentally known from German Published Application No. 33 31 426) selects a quantization characteristic of the quantizer 4 that is allocated to this maximum contrast. The structure and the functioning of the comparison means 36, of the logic circuits 40, 42 and 43 and of the selection control 44 are disclosed in German Published Application No. 33 31 426.

The limiting function that is realized within the time-critical path of circuit parts 7, 8, 15, 2, 4 and 11 (FIG. 3) by the subtractor 2b' operating parallel to 2b, by the multiplexer 24 and by the overflow recognition means 26 is realized in the control circuit of FIG. 4 in that a further subtractor 36' is provided in addition to the subtractor 36, whereby the second inputs of further subtractor 36' and subtractor 36 are connected parallel to one another. The first input of subtractor 36' is connected via a switch-over means 46 to the input A4 of the control circuit. Analogous to the circuit of the present invention according to FIG. 3, this input A4 is connected to the first input of the first adder 8 when the input signal at the second input of the first adder 8 is certain to be in the range $G^-$ through $G^+$. When, however, the value range at the first input of the first adder 8 has been defined from $G^-$through $G^+$, then the input A4 of the control circuit of FIG. 4 is connected to the second input of the first adder 8. The switch-over means 46 is thereby also controlled by the most significant bit that corresponds to the operational sign bit of the respective signal. The switch-over means 46 is again connected to lower and upper level values G−, G+, whereby one of these values is through-connected to the first input of the subtractor 36′ dependent on the operational sign of the signal at the first input of the first adder 8 (FIG. 3). When the appertaining signal has a positive operational sign, then the upper limit value G+ is forwarded onto the first input of the subtractor 36′; when, by contrast, it has a negative operational sign, the lower limit value G− is applied to the first input of the subtractor 36′. The outputs of 36, 36′ are applied to allocated inputs of the multiplexer 39 that connects only one of the subtractor outputs through to the input of the logic circuit 40 via switches 39a or 39b. In an analogous fashion, a further subtractor 37′ is allocated to the subtractor 37, whereby one of the outputs of the subtractors 37 or 37′ is connected through to the input of the logic circuit 42 via one of the switches 41a or 41b of the multiplexer 41 and the first input of the further subtractor 37′ is likewise connected to the switch-over means 46. The control of the switches 39a, 39b, 41a and 41b is dependent on the output signal of the overflow recognition means 26 that is supplied via the input A2. When $s_A$ remains within the value range defined by G+ and G−, then the switches 39a and 41a are closed when by contrast, the picture element signals $s_A$ exceeds the positive limit value G+ or the negative limit value G−, then the switches 39b and 41b are closed. Despite a maintained limiting function within the recursive circuit branch 7, 8, A1, 36 (37), 39 (41), 40 (42), 45, 4 and 11, a fast control of the quantizer 4 is thereby achieved since a nearly simultaneous addition in the adder 8 and subtraction in the subtractors 36, 36′ and 37, 37′ occurs.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An arrangement for DPCM coding of video signals, whereby estimated values (s) are subtracted from respective digitized picture element signals (s) and the difference signals thus obtained are utilized for signal transmission after a quantization and coding, the arrangement having a recursive signal path that contains a first adder (8) for forming reconstructed picture element signals ($s_R$) from the quantized difference signals and the estimated values, means for limiting which is a predictor (3) for forming the estimated values (s) and a subtraction means (2) for the formation of the difference signals, whereby the subtraction means (2) has first and second subtractors (2b, 2b′) and a multiplexer (24), the two subtractors each having an output connected via a multiplexer (24) to an input of at least one quantizer (4) that carries out the quantization, whereby a control input of the multiplexer is connected to a means for overflow recognition (26) controlled by an output of the first adder (8), comprising the two subtractors (2b, 2b′) having first inputs connected in parallel and receiving picture element signals or signals derived therefrom via a preceding subtractor (2a); a second input of the first subtractor (2b) of the subtraction means (2) connected to the output of the first adder (8); a second input of the second subtractor (2b′) of the subtraction means (2) connected to a means for switch-over (23); the switch-over means (23) receiving a lower limit value ($\alpha \cdot G^-$) of the first adder (8) weighed with $\alpha$ and an upper limit value ($\alpha \cdot G^+$) of the first adder (8) weighed with $\alpha$; the switch-over means (23) also connected to a first input of the first adder (8) when signals at a second input of G− through G+; the switch-over means (23) connecting one of the lower and upper limit values (G−, G+) to the second input of the second subtractor (2b′) dependent on the operational sign of a signal at the first input of the first adder (8).

2. An arrangement for DPCM coding of video signals, whereby estimated values (s) are subtracted from respective digitized picture element signals (s) and the difference signals thus obtained are utilized for signal transmission after a quantization and coding, the arrangement having a recursive signal path that contains a first adder (8) for forming reconstructed picture element signals ($s_R$) from the quantized difference signals and the estimated values, means for limiting which is a predictor (3) for forming the estimated values (s) and subtraction means (2) for the formation of the difference signals, whereby the subtraction means (2) has first and second subtractors (2b, 2b′) and a multiplexer (24), the two subtractors each having an output connected via a multiplexer (24) to an input of at least one quantizer (4) that carries out the quantization, whereby a control input of the multiplexer is connected to a means for overflow recognition (26) controlled by an output of the first adder (8), comprising the two subtractors (2b, 2b′) having first inputs connected in parallel and receiving picture element signals or signals derived therefrom via a preceding subtractor (2a); a second input of the first subtractor (2b) of the subtraction means (2) connected to the output of the first adder (8); a second input of the second subtractor (2b′) of the subtraction means (2) connected to a means for switch-over (23); the switch-over means (23) receiving a lower limit value ($\alpha \cdot G^-$) of the first adder (8) weighed with $\alpha$ and with an upper limit value $\alpha \cdot G^+$) of the first adder (8) weighed with $\alpha$; the switch-over means (23) also connected to a second input of the first adder (8) when signals at a first input of the first adder (8) lie within a value range formed by G− through G+; the switch-over means (23) connecting one of the lower and upper limit values (G−, G−) to the second input of the second subtractor (2b′) dependent on the operational sign of a signal at the second input of the first adder (8).

3. The arrangement according to claim 1, wherein the preceding subtractor (2a) receives the digitized picture element signals (s) via its first input; a second input of the subtractor (2a) connected to the output of the first adder (8) via a 2D or 3D predictor (19) and via a first limiter (18a); the second input of the preceding subtractor (2a) also connected to a first input of an additional adder (20) having a second input connected to the output of the first adder (8) via a second limiter (21) and whose output is connected to the second input of the first adder (8).

4. The arrangement according to claim 3, wherein the quantizer (4) is switchable to different quantization characteristics; wherein three reconstructed picture element signals ($s_B$, $s_C$ and $s_D$) are derived from at least one delay element (19); wherein a means for comparison (31) is provided in which the greatest ($x_2$) of these three picture element signals and the smallest ($x_3$) thereof are selected; wherein a reconstructed, current picture element signal ($x_1$) is taken at the output of the first adder (8); wherein the difference quantity ($x_1-x_2$) from the current picture element signal and the greatest picture element signal, the difference quantity ($x_1-x_2$) from the current picture element signal and the smallest picture element signal and the difference quantity ($x_2-x_3$) from the greatest and the smallest picture element signal are identified; wherein a logic circuit (40, 42, 43) is provided for each of these difference quantities, the allocation to a plurality of limit values and to amplitude classes thereby defined being identified in these logic circuits and a class-associate control signal ($s_{ST1}$, $s_{ST2}$, $s_{ST3}$) corresponding to this allocation being formed therein; wherein that control signal of the class-associated control signals that belongs to the greatest of the three difference quantities ($x_1-x_2$, $x_1-x_3$, $x_2-x_3$) is applied to a control input of the quantizer (4) via a second multiplexer (45), so that a quantization characteristic allocated to this class-associated control signal is selected; wherein yet a further subtractor (36') is provided in addition to the subtractor (36) forming the difference quantity between the current picture element signal ($x_1$) and the smallest of the picture element signals ($x_3$), whereby the respective difference between the upper or lower limit value (G+, G−) of the first adder (8) and the smallest of the second picture element signals ($x_3$) is formed in this further subtractor dependent on the operational sign of a signal at the input of the switch-over means (23); wherein a third multiplexer (39) controlled by the overflow recognition means (26) is provided, this third multiplexer forwarding only one of the results formed in the two subtractors 36', 36 to the allocated logic circuit (40) as the difference quantity ($x_1-x_3$) between the current picture element signal and the smallest picture element signal; wherein yet another additional subtractor (37') is provided in addition to the subtractor (37) that forms the difference quantity ($x_1-x_2$), between the current picture element signal and the greatest of the picture element signals, whereby the respect difference between the upper or lower limit value (G+, G−) of the first adder (8) and the greatest of picture element signals ($x_2$) is formed in this latter subtractor (37') dependent on the operational sign of a signal at the input of the switch-over means (23); and wherein a fourth multiplexer (41) controlled by the overflow recognition means (26) is provided, this fourth multiplexer forwarding one of the results formed in the two subtractors 37', 37 to the following logic circuit (42) as the difference quantity ($x_1-x_2$) between the current picture element signal and the greatest picture element signal.

5. The arrangement according to claim 4, wherein the second multiplexer (45) is controlled via a selection control (44) that receives the operational sign of the difference quantities supplied to the logic circuits (40, 42 and 43).

6. The arrangement according to claim 2, wherein the preceding subtractor (2a) receives the digitized picture element signals (s) via its first input; a second input of the subtractor (2a) connected to the output of the first adder (8) via a 2D or 3D predictor (19) and via a first limiter (18a); the second input of the preceding subtractor (2a) also connected to a first input of an additional adder (20) having a second input connected to the output of the first adder (8) via a second limiter (21) and whose output is connected to the second input of the first adder (8).

7. The arrangement according to claim 6, wherein the quantizer (4) is switchable to different quantization characteristics; wherein three reconstructed picture element signals ($s_B$, $s_C$ and $s_D$) are derived from at least one delay element (19); wherein a means for comparison (31) is provided in which the greatest ($x_2$) of these three picture element signals and the smallest ($x_3$) thereof are selected; wherein a reconstructed, current picture element signal ($x_1$) is taken at the output of the first adder (8); wherein the difference quantity ($x_1 1-x_2$) from the current picture element signal and the greatest picture element signal, the difference quantity ($x_1-x_3$) from the current picture element signal and the smallest picture element signal and the difference quantity ($x_2-x_3$) from the greatest and the smallest picture element signal are identified; wherein a logic circuit (40, 42, 43) is provided for each of these difference quantities, the allocation to a plurality of limit values and to amplitude classes thereby defined being identified in these logic circuits and a class-associated control signal ($s_{ST1}$, $s_{ST2}$, $s_{ST3}$) corresponding to this allocation being formed therein; wherein that control signal of the class-associated control signals that belongs to the greatest of the three difference quantities ($x_1-x_2$, $x_1-x_3$, $x_2-x_3$) is applied to a control input of the quantizer (4) via a second multiplexer (45), so that a quantization characteristic allocated to this class-associated control signal is selected; wherein yet a further subtractor (36') is provided in addition to the subtractor (36) forming the difference quantity between the current picture element signal ($x_1$) and the smallest of the picture element signals ($x_1$), whereby the respective difference between the upper or lower limit value (G+, G−) of the first adder (8) and the smallest of the second picture element signals ($x_3$) is formed in this further subtractor dependent on the operational sign of a signal at the input of the switch-over means (23); wherein a third multiplexer (39) controlled by the overflow recognition means (26) is provided, this third multiplexer forwarding only one of the results formed in the two subtractors 36', 36 to the allocated logic circuit (40) as the difference quantity ($x_1-x_3$) between the current picture element signal and the smallest picture element signal; wherein yet another additional subtractor (37') is provided in addition to the subtractor (37) that forms the difference quantity ($x_1-x_2$), between the current picture element signal and the greatest of the picture element signals, whereby the respect difference between the upper or lower limit value (G+, G−) of the first adder (8) and the greatest of picture element signals ($x_2$) is formed in this latter subtractor (37') dependent on the operational sign of a signal at the input of the switch-over means (23); and wherein a fourth multiplexer (41) controlled by the overflow recognition means (26) is provided, this fourth multiplexer forwarding one of the results formed in the two subtractors 37', 37 to the following logic circuit (42) as the difference quantity ($x_1-x_2$) between the current picture element signal and the greatest picture element signal.

8. The arrangement according to claim 7, wherein the second multiplexer (45) is controlled via a selection control (44) that receives the operational sign of the difference quantities supplied to the logic circuits (40, 42 and 43).

* * * * *